(12) United States Patent
Kuchibhotla et al.

(10) Patent No.: US 7,106,415 B2
(45) Date of Patent: Sep. 12, 2006

(54) ILLUMINATION COMPENSATOR FOR CURVED SURFACE LITHOGRAPHY

(75) Inventors: Sivarama K. Kuchibhotla, Croton on Hudson, NY (US); Kanti Jain, Hawthorne, NY (US); Marc A. Klosner, White Plains, NY (US)

(73) Assignee: Anvik Corporation, Hawthorne, NY (US)

( * ) Notice: Subject to any disclaimer, the term of this patent is extended or adjusted under 35 U.S.C. 154(b) by 0 days.

(21) Appl. No.: 10/731,187

(22) Filed: Dec. 9, 2003

(65) Prior Publication Data

US 2005/0122494 A1    Jun. 9, 2005

(51) Int. Cl.
*G03B 27/68*    (2006.01)
*G03B 27/58*    (2006.01)
*G03B 27/42*    (2006.01)

(52) U.S. Cl. ............................ 355/52; 355/47; 355/53

(58) Field of Classification Search .................. 355/47, 355/52, 53, 55, 67, 72; 430/5, 20, 22; 250/548; 359/744–795

See application file for complete search history.

(56) References Cited

U.S. PATENT DOCUMENTS

| | | | | |
|---|---|---|---|---|
| 4,015,897 A | * | 4/1977 | Konoma et al. | 359/740 |
| 5,166,830 A | * | 11/1992 | Ishibai et al. | 359/717 |
| 5,200,861 A | * | 4/1993 | Moskovich | 359/662 |
| 5,757,552 A | * | 5/1998 | Murayama et al. | 359/658 |
| 5,917,594 A | * | 6/1999 | Norton | 356/327 |
| 6,416,908 B1 | * | 7/2002 | Klosner et al. | 430/5 |

* cited by examiner

*Primary Examiner*—Henry Hung Nguyen
(74) *Attorney, Agent, or Firm*—Carl C. Kling (57) ABSTRACT

A zero power identical pair of oppositely-oriented meniscus lens elements mounted in the projection light path, serves as curved mask support while compensating for optical anomalies such as beam shift and beam deviations produced by other transparent supports for the curved mask. The zero-power meniscus lens pair, without affecting the transmission beam characteristics, lets the beam diffract as efficiently as does a regular planar mask, thus preserving the partial coherence effects and resolution concepts of projection lithography. This simple but novel optics device is not only expected to clear several barriers for curved mask projection lithography but also find place in other applications where collimated or converging light beams have to travel extra paths without significant aberration.

12 Claims, 3 Drawing Sheets

ILLUMINATION COMPENSATOR FOR CURVED SURFACE LITHOGRAPHY

CROSS-REFERENCE TO RELATED APPLICATIONS (Not Applicable)

STATEMENT REGARDING FEDERALLY SPONSORED RESEARCH OR DEVELOPMENT (Not Applicable)

REFERENCE TO A MICROFICHE APPENDIX (Not Applicable)

BACKGROUND OF THE INVENTION (1) Field of the Invention

This invention relates to projection lithography systems for imaging onto curved substrates, and more particularly relates to a large-area lithography system featuring a curved mask that is identical in size and shape to the curved substrate. An axially moving 1:1 projection lens achieves a constant optical path length for conjugate image points in order to maintain the substrate surface within the depth-of-focus, thereby providing an effective depth-of-focus much larger than the depth-of-focus of the projection optics itself. This invention is centered around a novel illumination compensator which we call 'Zerogon', that is part of an illumination system and protects the converging illumination beam from various image anomalies when it transmits through a curved mask. This unique optical system with curvatures on its elements has zero power and works like an un-tilted plane glass blank in the path of a given collimated or convergent beam. A detailed paraxial ray theory was developed to demonstrate the functionality of such a device. Two possible configurations for Zerogon have been described in the invention. The unique device facilitates patterning on curved surfaces by means of small-field seamless scanning techniques to achieve high resolution over an entire large-area curved substrate. The concept of compensation described here is applicable in any generic optical system involved with illumination or imaging beams.

(2) Description of Related Art

Introduction to Optical Projection Lithography

In the recent past, electronics industry has witnessed dramatic increase in performance, throughput, yield and cost reduction with the advances in optical projection lithography. On the other hand, detector technology promises tremendous future for curved focal plane arrays (FPAs) in strategic and astronomical applications. Contact and non-contact projection lithography faces several challenges in patterning intricate details on curved surfaces. Anvik's systems are designed based on a novel, hexagonal seamless scanning concept and single-planar stage system configuration that provide both high optical and scanning efficiencies, and combine high-resolution imaging with very large exposure area capability. The prior art of Anvik's techniques for imaging on curved substrates has a curved mask that is identical in size and shape to the curved substrate for 1:1 patterning. There is a good description of curved-mask lithography in U.S. Pat. No. 6,416,908, PROJECTION LITHOGRAPHY ON CURVED SUBSTRATES, Klosner, Zemel, Jain & Farmiga, Jul. 9, 2002. However, a curved mask, because of its finite thickness, can cause several image anomalies due to its interaction with the illumination beam. In this invention, we propose and use a novel optical device, which we call 'Zerogon' that compensates for the image degradation associated with the use of curved masks.

Importance of the Illumination System

It has been a well-known fact from the times of invention of the microscope that the resolution and contrast of the microscope are significantly influenced by the technique of illumination of the sample. Similarly, the illumination technique can make a significant impact on the resolution and contrast of a lithographic projection system too. Though the illumination system is probably the most neglected or ignored part in such systems, some recent advances in illumination systems play great role in controlling the performance such as resolution, depth of focus and image contrast of a lithographic projection system. A few of these techniques are popularly known as off-axis illumination, annular source illumination, slit source illumination, 2-point source illumination, SHRINC illumination and use of phase shift masks.

Brief Review of Existing Illumination Techniques for Planar Masks

It has been an established fact that the use of curved Focal Plane Arrays (FPAs) can significantly influence the space and military applications in achieving wide fields-of-view for their sensors. Some of the techniques used for manufacturing these curved FPAs use curved masks in their projection systems. The several illumination techniques described above assume the use of planar masks in the object plane of the projection system. Use of curved masks in the object plane can cause severe image degradation due to defocus and beam deviations at the curved object plane. Problems associated with defocus of the condensed beam at the curved mask surface can be addressed by using special image motion compensating techniques within the condenser and the projection lens. On the other hand, beam deviations at the curved mask surface can significantly impact the light coupling between condenser and the projection lens affecting the partial coherence factor, which is the ratio of numerical apertures of condenser and the projection lens. A partial coherence factor value of 0.7 is normally chosen for incoherent illumination to achieve best resolution with projection lithography. In this paper, we describe a novel method to control the beam deviations at the curved mask plane, thereby protecting the partial coherence factor and the resolution characteristics of the imaging system.

BRIEF SUMMARY OF THE INVENTION

This invention provides to a large-area lithography system the capability of patterning onto a curved substrate, using a curved mask in order to achieve a fixed track length for conjugate object and image points, by linearly moving a 1:1 projection lens for compensation on a small-field seamless scanning platform, thereby maintaining the curved substrate surface within its depth-of-focus, and by providing an effective coupling of the illumination beam from the curved mask to the projection lens, thereby preserving the partial coherence factor and the related resolution characteristics.

This invention provides these capabilities while retaining the option of small-field seamless scanning techniques to achieve high resolution over the entire large-area curved substrate.

The object of the invention is to make possible a high-resolution projection imaging operation on a curved substrate with topographical variations significantly greater than the depth-of-focus of the imaging optics.

Another object of the invention is to permit scanning projection imaging, by providing an effective solution for beam coupling mechanism using an innovative optical system power meniscus lens pair that carries the curved mask on one of its surfaces.

Another innovative feature of the invention is to provide, a unique design for zero-power meniscus lens pair by means of a symmetric arrangement of two identical meniscus optical elements so that it works as a null compensator for collimated or converging beams interacting with a curved mask and thus causing negligible deviation or shift of the beam passing through such a device.

An advantage of such unique configuration for zero-power meniscus lens pair is that the design could be scaled up to conduct large-area curved patterning with relatively smaller cross-section of scanning convergent beam imaging on one of its outer surfaces thus facilitating large-area seamless scanning for curved—curved lithography.

Other objects, features and advantages of the invention will be apparent to those skilled in the art, in view of the drawings and written description.

DETAILED DESCRIPTION OF THE INVENTION

Figure 1:
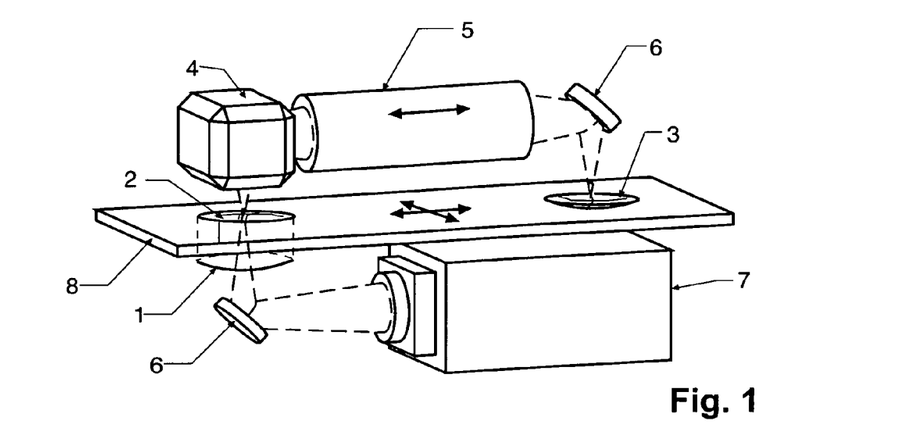
FIG. 1 is a simplified semidiagrammatic elevation view of a preferred embodiment of the invention, showing a compensated curved mask with zero-power meniscus lens pair and curved substrate that lead to an effective beam coupling.
Figure 2:
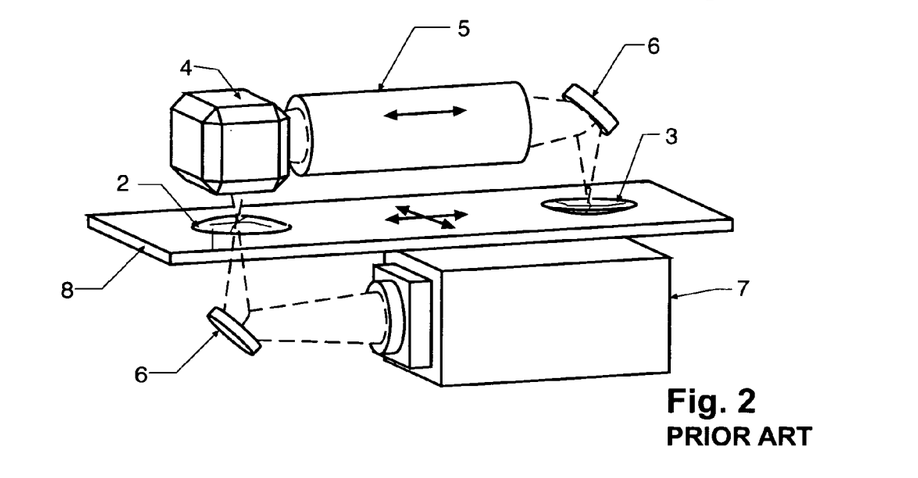
FIG. 2 is a simplified semidiagrammatic elevation view of a PRIOR ART imaging system similar to the preferred embodiment of the invention, showing uncompensated curved mask and curved substrate that lead to an ineffective beam coupling in a folded mask-on-stage projection embodiment of PRIOR ART.
Figure 3:
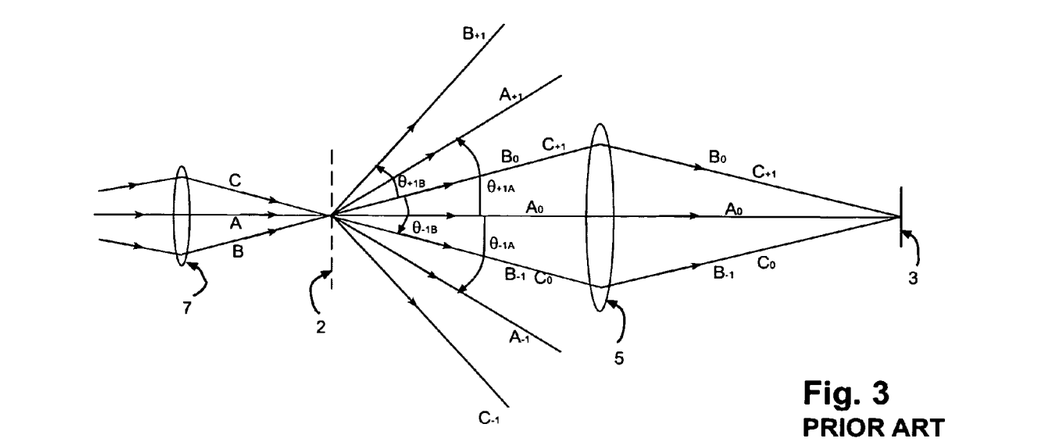
FIG. 3 illustrates the basic illumination characteristics in projection lithography, in which the PRIOR ART mask, usually in the form of a grating, diffracts the incoming beam into zero-and-higher orders.
Figure 4:
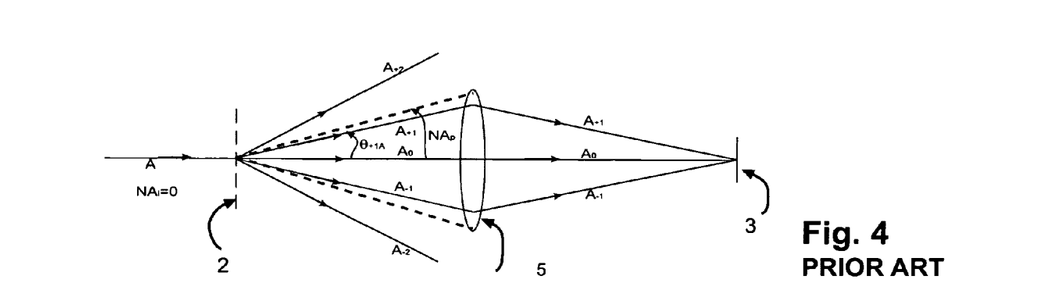
FIG. 4 is a PRIOR ART showing illumination characteristics in projection lithography under coherent illumination.
Figure 5:
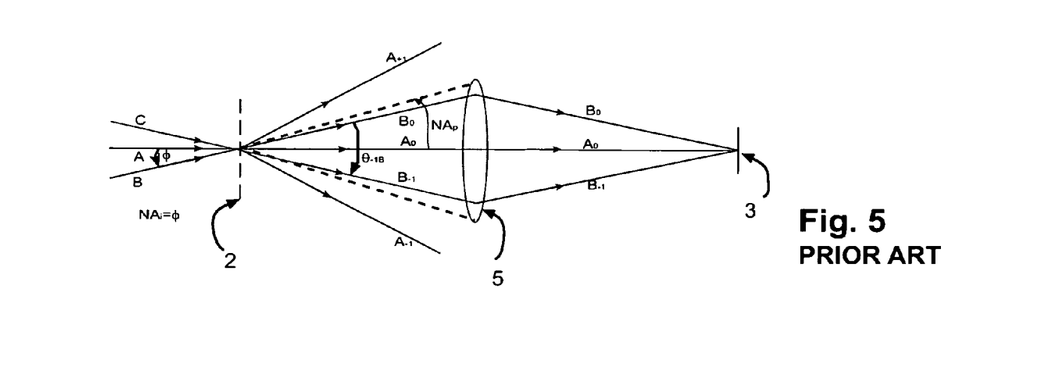
FIG. 5 is a PRIOR ART showing illumination characteristics in projection lithography under incoherent illumination.

FIG. 1 and FIG. 2 show the preferred embodiment for patterning onto curved substrates by using a zero-power meniscus lens pair 1, mask 2 having a curvature that is identical to that of the substrate 3 (i.e., the size and shape of the mask 2 and substrate 3 are the same) by additionally performing the imaging using a 1:1 projection imaging system featuring reverser 4, projection lens 5, and fold mirrors 6 as required in directing the patterning beam from illumination source 7 to substrate 3. Stage 8 provides scanning motion. All elements of FIG. 2 (PRIOR ART) are also present in FIG. 1. The difference between the system of FIG. 1 and the PRIOR ART system of FIG. 2 is the presence of the zero-power meniscus lens pair 1, in FIG. 1 and the absence of the zero-power meniscus lens pair 1, in FIG. 2. The zero-power men iscus lens pair 1, in FIG. 1 provides an effective beam coupling between the curved mask and the projection lens.

We hereby discuss the basis of our invention, initially dealing with planar masks and then with the problems associated with thick curved masks. The discussions would finally evolve into the subject of the current invention that significantly improves the performance of curved mask lithography.

Patterning on Curved Surfaces Using an Anvik Seamless Scanning System—PRIOR ART—FIG. 2

FIG. 2 illustrates the configuration of a curved mask and curved substrate when lithography is performed utilizing an Anvik large-area seamless scanning microlithography system, as described in U.S. Pat. No. 6,416,908, issued Jul. 9, 2002. The Anvik system uses a hexagonal image field to achieve seamless scanning, and a reverser unit, which maintains the required image orientation on the substrate. Elements of greatest significance in FIGS. 1 & 2 are: curved mask 2; curved substrate 3; reverser 4; projection lens 5, illumination source 7 and scanning platform 8. The curved substrate 3 and curved mask 2 are situated on a common scanning platform 8, simplifying the overall system design. Note that since this is a seamless scanning system, the mask can be significantly larger than the image field. When the Anvik system is configured using this invention for patterning a curved mask onto a curved substrate, the mask and substrate sit on the single scanning platform, with the mask oriented in an inverted manner with respect to the substrate. With this configuration, a constant track length is maintained from any object point on the mask to its conjugate image point on the substrate. Separate means of oppositely directed motion provide motion to projection means 5 to correct defocus due to curved object surface and curved image surface. The illumination means typically includes condensing means having zoom capability to keep the size and focus of the illumination beam constant on the mask.

Basic Illumination Characteristics

Illumination Systems with Planar Masks

All the lithographic tools based on optical projection lithography employ an illumination system that transmits uniform illumination through a mask from a laser source to the projection lens. The mask, usually in the form of a grating, diffracts the incoming beam into zero- and higher orders depending on the period d of the mask, wavelength of operation $\lambda$ and angle of incidence $\phi$ as given by the following relation, $$d(\sin\theta - \sin\phi) = n\lambda \quad (1)$$

where θ is the angle of diffraction of order n. The spatial information about the mask is contained in the diffracted light. To achieve the perfect edge definition in the image plane all spatial frequencies of the mask must be captured by the projection lens and combined with zero-order beam at the image plane. Aerial image quality begins to suffer when the projection lens can no longer transmit the higher-order frequencies. At the limit of resolution, only one or the both of the first-order beams are collected and combined with the zero-order beam. Beyond the resolution limit of the lens, the diffraction angle produced by the feature size is so large that the lens cannot transmit even the first-order beams and only the zero-order beam is transmitted producing a uniform irradiance in the image plane. The modulation or contrast and thus the resolution of the image is then totally lost beyond the theoretical limit of resolution.

The resolution limit and contrast of the image are typically defined by the degree of coherence of the illumination beam. In the coherent case, light is collimated perpendicular to the mask, and the light diffracted through the mask with an angle θ is captured by the projection lens provided θ≦NA of the projection lens. In the case of incoherent illumination, light can be diffracted at 2NA and still be collected by the projection lens so that the first-order beams can combine with the zero-order beam to provide the limited resolution. Thus, from equation (1) the highest spatial frequency $v_{max}$ that can be imaged by the projection lens under coherent and incoherent illumination can be written as $$v_{\text{max\_coherent}} = \frac{1}{d} = \frac{NA}{\lambda} \quad (2)$$

$$v_{\text{max\_incoherent}} = \frac{1}{d} = \frac{2NA}{\lambda}$$

Though incoherent illumination provides twice the resolution as that of coherent illumination, higher spatial frequencies suffer from lower contrast in the projected image under incoherent illumination. It has been an established practice since the age of microscope to choose an optimum partial degree of coherence σ between the two extremes to balance the resolution and contrast. σ is often referred to as partial coherence factor and is defined by the ratio of NA of illumination system to that of projection system.

$$\sigma = \frac{NA_{illumination}}{NA_{projection}} \quad (3)$$

For cases of NA of illumination system tending to zero or a collimated beam, σ=0 (coherent); and for cases where NA of illumination system equals or becomes greater than that of projection system, σ≧1 (incoherent). It is generally considered that the best illumination for optimum pattern transfer in conventional photoresists is by setting a σ value of ~0.7 (partial coherence).

Problems Associated with Uncompensated Curved Masks

It is now easy to realize the importance of an effective coupling between illumination system and the projection lens by means of partial coherence factor in the field of projection imaging. Use of planar masks at the intermediate focus obviously does not pose any challenge to any projection mechanism as they neither deviate nor distort the illuminated beam. On the other hand, a curved mask surface can significantly distort the transmitting illuminating beam, depending on the structure of the mask device, causing sever image anomalies and loss of resolution. In this invention, we enhance our prior art Anvik system for curved surface lithography with a new illumination compensator that eliminates practically all the problems associated with a curved mask.

Design of a Curved Mask Compensator

Design Principles of Such a Device

The basic goal of designing an illumination compensator for a curved mask is to transmit the converging scanning beam undistorted in its direction and position of exit while it excurses over the curved mask during scanning. The direction of the chief ray of the converging beam is preserved to maintain an effective coupling so that the lens collects the necessary diffracting orders. Angle of each ray with respect to chief ray within the converging beam is preserved to maintain the numerical aperture of the illumination system, and thus the partial coherence factor. This essentially calls for such an optical device, which holds the curved mask and acts like an optically powerless component as in the case of a planar mask. The basis of this invention is centered on such an optical device that is transparent to the incoming radiation and holds the curved mask on one of its outer curved surfaces and transmits the radiation without any significant image anomalies.

In this section we derive some basic relationships among the constructional parameters of such a device. Let us think of a positive meniscus element with its convex surface as the mask carrier for the purpose. Initially, we derive some basic relations in the context of using such a single meniscus element. In the later part, we discuss some major advantages of using a symmetric meniscus doublet for holding a curved mask on one of its outer surfaces.

We derive here the basic paraxial relationships among the constructional parameters to design and understand the behavior of meniscus elements in the context of using them as illumination compensator. The equations are based on the standard paraxial trace of a given ray within the optical system. The symbols in these equations have the following meaning with subscripts indicating the surface number under discussion.

u and u' are the slopes of the ray before and after refraction at a given surface;

y is the height of the ray on a surface;

t is the vertex spacing between two consecutive surfaces;

n and n' are refractive indices of the medium before and after refraction

Meniscus Element:

Let the radii of curvature of the surfaces on a meniscus element be $R_1$ and $R_2$. For a ray traveling at angle $u_1$ and striking the first surface at height $y_1$, the refraction is given by $$u'_1 = \frac{nu_1}{n'} - \frac{y_1(n'-n)}{R_1 n'}$$

For first element, n'=N and n=1, where N is the refractive index of the glass material of the element. Thus, $$u'_1 = \frac{u_1}{N} - \frac{(N-1)}{N}\frac{y_1}{R_1} \qquad (4)$$

The ray transfers and intersects the second surface at $$y_2 = y_1 + t_1 u'_1 = \left(1 - \left(\frac{N-1}{N}\right)\frac{t_1}{R_1}\right)y_1 + \frac{t_1}{N}u_1 \qquad (5)$$

Refraction at second surface may now similarly be derived as eqn. (4) and on simplification we get, $$u'_2 = u_1 - (N-1)\left[\frac{y_1}{R_1} - \frac{y_2}{R_2}\right] \qquad (6)$$

Figure 6:
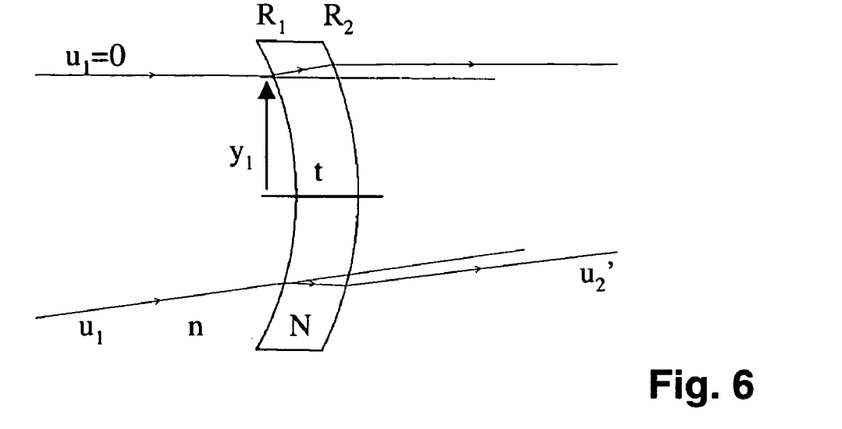
FIG. 6 is a diagram showing how a meniscus lens shifts the light beams passing through it, and if allowed to carry the mask on its outer surface, can cause an ineffective coupling of the illumination beam to the projection lens.

At this moment it is worth making a note on the performance of a single meniscus element with ray entering on concave surface and emitting from the convex surface as shown in FIG. 6. In order to perform like non-deviating element for a given ray with slope $u_1$, we would like to have $$u_2' = u_1$$

and, Eqn. (6) would then give $$\frac{y_1}{R_1} = \frac{y_2}{R_2} \qquad (7)$$

On substitution of Eqn. (5) in Eqn. (7), we get $$R_1 - R_2 = \frac{(N-1)}{N}t_1 - \frac{t_1 u_1 R_1}{Ny_1} \qquad (8)$$

As explained earlier, the objective of designing this optical system is to transmit the collimated or converging beam undeviated without any lateral shift when the optical system moves perpendicular to its optical axis. In the case of a single meniscus Eqn. (8) is never satisfied, as the constructional parameter $\Delta R$ (i.e., $R_1-R_2$) is a function of both thickness and $u_1$. The dependence of $\Delta R$ on $u_1$ can only be eliminated for collimated beam for which $u_1=0$. However, for the ray in a convergent beam with $u_1 \neq 0$, Eqn. (7) is never satisfied and $u_2' \neq u_1$, affecting partial coherence factor when the convergent beam excurses over a curved surface. The dependence of $\Delta R$ on $t_1$ is possible for a meniscus with identical radii of curvature with zero thickness. It is, however, hard to realize such a meniscus optical element with negligible thickness capable of transmitting UV radiation.

On the other hand, a meniscus optical element with finite thickness can be made to have selected radii of curvature in compliance with Eqn. (8) so that the element would not deviate an axial or collimated ray (with $u_1=0$) after refraction through the element. That is, $$\Delta R = R_1 - R_2 = \frac{(N-1)}{N}t_1 \qquad (9)$$

However, for a beam with $\Delta R$ given by Eqn. (9), Eqn. (5) gives us, $$\Delta y = y_1 - y_2 = \frac{(N-1)}{N}\frac{t_1 y_1}{R_1} = \frac{\Delta R y_1}{R_1} \qquad (10)$$

Even for collimated beams with $u_1=0$, Eqn. (10) still predicts the unwanted lateral shift $\Delta y$. In summary, Eqns. (6)–(10) describe that a single meniscus element with finite thickness needs to have different radius of curvature on each of its surfaces as given by Eqn. (9) to make the ray of a collimated beam undeviated after passing through the element. However, for the ray in a convergent beam with $u_1 \neq 0$, Eqn. (7) is never satisfied and affects the numerical aperture and also the partial coherence factor especially when the convergent beam excurses over a curved surface. Also, the ray undergoes a lateral shift $\Delta y$ as given by Eqn. (10) that is a function of ray height $y_1$ on front surface. Thus a single meniscus element suffers from both drawbacks of deviating and shifting the ray laterally on second surface depending on the ray angle and its height on first surface. This is very undesirable for scanning systems such as seamless scanning technique because the beam or the ray excurses nonuniformly over the second surface. This would call for a complicated scanning mechanism to make the beam travel uniformly on the curved surface. Hence, a single meniscus element would not serve the required purpose of an illumination compensator for curved masks in making the beam transmit without deviation or shift.

Figure 7:
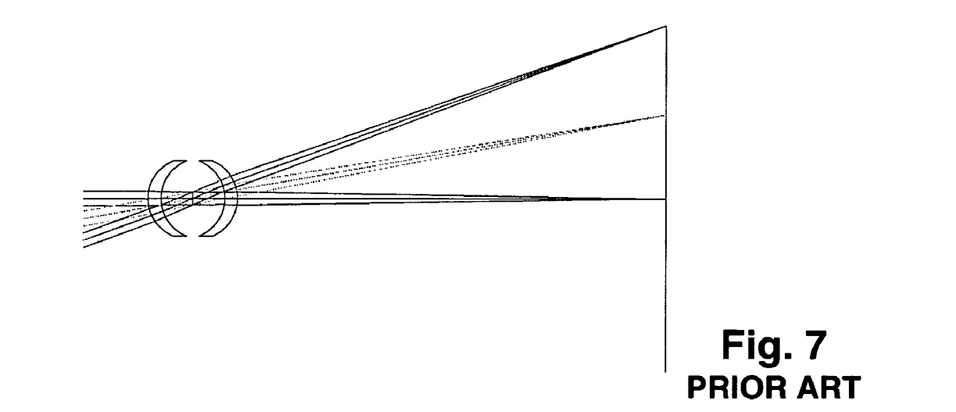
FIG. 7 is a PRIOR ART diagram showing how the conventional lens pair called the "Hypergon" acts as an imaging system and is significantly different from zero-power meniscus lens pair, in construction and performance.

The Goerz Hypergon lens (U.S. Pat. No. 706,650), a traditional photographic objective, consists of two symmetrical menisci equidistant on either side of the aperture stop. The inner and outer radii of curvature of the Goerz Hypergon differ by only one-half percent, producing a very flat Petzval curvature even at very large field of view. The aperture stop between the menisci is important in the Goerz Hypergon lens; this arrangement generates lens power as shown in FIG. 7. However, in the current application we need to project the condensed beam onto a curved surface of an optical system, which on refraction would not deviate the beam. This calls for a zero-power optical system, the outer surface on which the converging illumination beam is in focus, scans the curved surface with the help of unitary stage. In other words, we need to consider an optical system with diameter larger than the scanning beam. The purpose of such an optical device is not to deviate the transmitted beam on exit. This can only be achieved by transmitting the beam through a zero-power optical device as that of a plane parallel plate. In this section, we discuss the design and function of such a device that we will call zero-power meniscus lens pair 1. The zero-power meniscus lens pair 1 has an outer curved surface and would not deviate nor shift the beam laterally on transition. In the current application, the outer curved surface of the zero-power meniscus lens pair 1 carries the curved mask 2.

Figure 8:
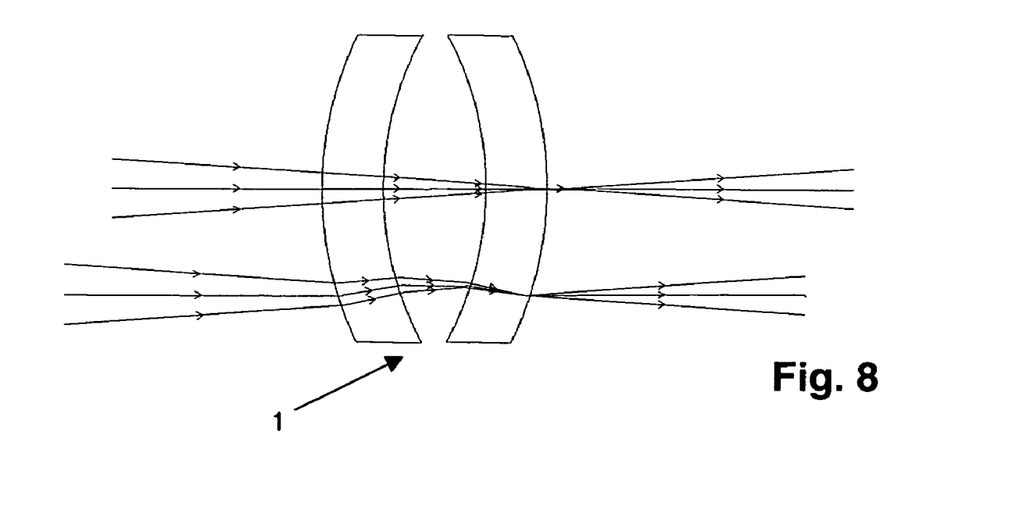
FIG. 8 is a diagram showing how a lens pair, such as the zero-power meniscus lens pair, transmits the light beams without any deviations, and hence can provide an effective coupling of the illumination beam to the projection lens.
Figure 9:
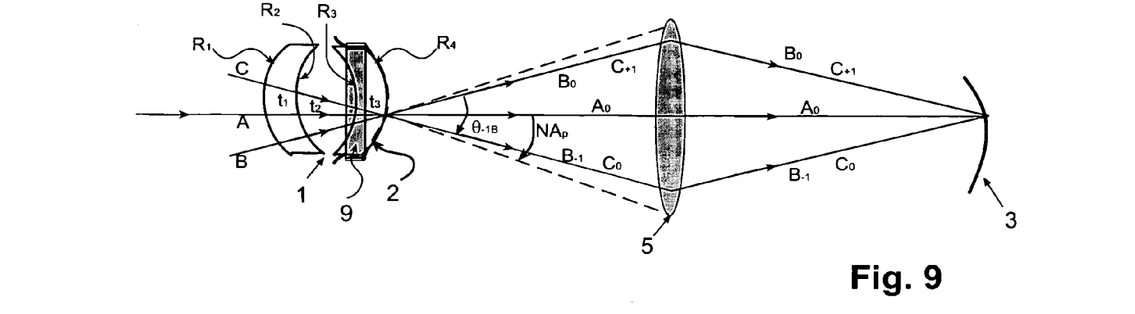
FIG. 9 is an unfolded diagram showing how the zero-power meniscus lens pair, mask combination helps the projection lens collect the necessary diffraction orders.

The zero-power meniscus lens pair 1 has two identical menisci with their radii of curvature set by Eqn. (9) and the elements grouped in close proximity, with their concave surfaces facing each other as shown in FIG. 8. The outer surface holds the flexible mask 2 close enough using a locking band 9. The goal of designing such an optics device is to make the small-sized illuminating beam transmit through the optic at any height from the optical axis of the zero-power meniscus lens pair 1, without any deviation or shift to preserve the concept of providing constant partial coherence factor for the sake of obtaining better resolution and contrast in curved mask lithography. As proved in this section, the symmetry of the configuration cancels out the lateral shifts introduced by each meniscus without deviating the ray through the system and thus preserving the numerical aperture of the condenser and resolution characteristics of the projection system. Notice that the lookalike Hypergon on the other hand, is an imaging system as shown in FIG. 7, with construction and performance significantly different from that of the zero-power meniscus lens pair 1. FIG. 7 shows how the Hypergon of PRIOR ART has lens power. FIG. 9 shows how the placement of the mask 2 on the convex exit surface of the zero-power meniscus lens pair 1, with the focus on the curved mask 2, allows for proper focus of the projected beam onto the curved substrate 3.

We may now extend the above raytracing equations to zero-power meniscus lens pair 1. In order to work out a zero-power meniscus lens pair 1, let us consider a lens doublet of two identical menisci with concave surfaces facing each other. Let us assume that the second meniscus element, separated from the first meniscus by a distance $t_2$, has radii of curvature $R_3$ and $R_4$ and thickness $t_3$. The transfer equation to third surface may now be written as $$y_3 = y_2 + t_2 u_2' \quad (11)$$

and refraction at third surface yields $$u_3' = \frac{nu_3}{n'} - \frac{y_3(n'-n)}{R_3 n'} \quad (12)$$

In view of identical menisci for Zerogon, we can write n=1, n'=N and $u_3 = u_2'$ for third surface;
n=N, n'=1 and $u_4 = u_3'$ for fourth surface;
$R_3 = -R_2$ and $R_4 = -R_1$ and $t_3 = t_1$.

Substitution of Eqn. (11) in the above equation gives us $$u_3' = \left[\frac{1}{N} + \left(\frac{N-1}{N}\right)\frac{t_2}{R_2}\right]u_2' + \left(\frac{N-1}{N}\right)\frac{y_2}{R_2} \quad (13)$$

Transfer to fourth surface may now be written as $$y_4 = y_3 + t_3 u_3'$$

Substitution of Eqns. (11)–(13) and further simplification leads to $$y_4 = \left[1 + \left(\frac{N-1}{N}\right)\frac{t_1}{R_2}\right]y_2 + \left[t_2 + t_1\left(\frac{1}{N} + \left(\frac{N-1}{N}\right)\frac{t_2}{R_2}\right)\right]u_2' \quad (14)$$

For an axial ray or ray incident at a height $y_1$ from optical axis with $u_1 = 0$ and thus $u_2' = 0$, Eqns. (6), (7) and (9) yield $$y_4 = \left(1 + \frac{\Delta R}{R_2}\right)y_2 = y_1$$

Thus a would not cause any shift in the height of the axial ray unlike a single meniscus lens. Now, let us see the deviation of a ray produced by the device.

The equation for refraction at fourth surface may now be written as $$u_4' = \frac{nu_4}{n'} - \frac{y_4(n'-n)}{R_4 n'}$$
$$= N u_3' - \frac{(N-1)}{R_1} y_4$$

Use of Eqns. (13) and (14) in the above equation and further simplification yields $$u_4' = \left[1 + \frac{(N-1)t_2}{R_1 R_2}\left[\Delta R - \frac{(N-1)}{N}t_1\right] - \frac{(N-1)}{N}\frac{t_1}{R_1}\right]u_2' +$$
$$\frac{(N-1)}{R_1 R_2}\left[\Delta R - \frac{(N-1)}{N}t_1\right]y_2$$

Using Eqn.(6) for $u_2'$ and Eqn.(5) for $y_2$ there in, we get $$u_4' = \left[1 + \frac{(N-1)t_2}{R_1 R_2}\left(\Delta R - \frac{(N-1)}{N}t_1\right) - \frac{(N-1)}{N}\frac{t_1}{R_1}\right] \times \quad (15)$$
$$\left[\left(1 + \frac{(N-1)}{N}\frac{t_1}{R_2}\right)u_1 - (N-1)\left(\Delta R - \frac{(N-1)}{N}t_1\right)\frac{y_1}{R_1 R_2}\right] +$$
$$\frac{(N-1)}{R_1 R_2}\left(\Delta R - \frac{(N-1)}{N}t_1\right)y_2$$

It is now easy to explain how Eqn.(9) could help a zero-power meniscus lens pair 1 achieve the function of the required illumination compensator without deviation and shift of a ray. When Eqn.(9) is satisfied, Eqn.(15) can be simplified to $$u_4' = \left(1 - \frac{(N-1)}{N}\frac{t_1}{R_1}\right)\left(1 + \frac{(N-1)}{N}\frac{t_1}{R_2}\right)u_1 \quad (16)$$
$$= \left(1 - \frac{\Delta R}{R_1}\right)\left(1 + \frac{\Delta R}{R_2}\right)u_1$$
$$= u_1$$

A Numerical Example

The zero-power meniscus lens pair 1 worksheet below illustrates the calculations for a sample zero-power meniscus lens pair 1, worked out for an outer radius of curvature of R=50 mm and thickness of 10 mm. The calculations were done for a displaced axial ray and an off-axial ray entering the lens with an angle. Initially it is required to compute the inner radius of curvature of the meniscus elements for a given value of radius on the outer surface using Eqn. (9) and then the above set of equations or any standard optical design software can be used to evaluate the design. The paraxial raytrace values of a given ray as given in the table may be compared with the real raytrace values that fall in close agreement with each other.

| Parameter/i | 0 | 1 | 2 | 3 | 4 |
|---|---|---|---|---|---|
| $t_i$ | | 10.000 | 12.000 | 10.000 | |
| $n_i'$ | | 1.509 | 1.000 | 1.509 | 1.000 |
| $R_i$ | | −50.000 | −46.627 | 46.627 | 50.000 |
| $y_i$ | | 12.500 | 11.657 | 11.657 | 12.500 |
| $u_i$ | 0.000 | 0.000 | −0.084 | −0.084 | 0.000 |
| $y_{pi}$ | | 10.632 | 8.011 | 1.848 | −0.061 |
| $u'_{pi}$ | −0.276 | −0.254 | −0.294 | −0.187 | −0.276 |

It may be seen that the zero-power meniscus lens pair 1 preserves $y_i$, $u_i$, and $u'_{pi}$ of any given ray on first and fourth surfaces, having the same functional properties as that of a plane parallel plate. In fact, it is easier to prove and visualize the zero-power meniscus lens pair 1 as equivalent to a pair of plane parallel plates separated by the same distance as that of menisci in zero-power meniscus lens pair 1. The optical path length variation for any arbitrary ray in meniscus elements is compensated by the altered air path between the menisci.

An application of the zero-power meniscus lens pair 1 is its use at intermediate curved image surfaces with the image surface falling on zero-power meniscus lens pair 1's outer surface whose radius of curvature could be designed to the field curvature of the optics in front of the zero-power meniscus lens pair 1. The description and example above emphasize its behavior equivalent to that of a plane parallel plate with curved surfaces. Hence, wherever a plane parallel plate has to be replaced by an optic with curved surfaces, the zero-power meniscus lens pair 1 could be used without affecting the performance of whole system.

Use of Zero-power Meniscus Lens Pair 1 for Curved Lithography.

As described earlier, the illuminated beam from the condenser could be effectively coupled to the projection lens by resting the curved mask on an optical device that transmits the beam undistorted. A zero-power meniscus lens pair 1, with its outer radius of curvature to match with that of the substrate and a membrane mask, that is proprietary to Anvik technology, will be precisely stretched and secured over the outer surface by a frame to fix its position. The zero-power meniscus lens pair 1-curved mask combination works just like that of a planar mask providing an efficient coupling between illumination system and the imaging system for curved lithography. FIG. 9 is a schematic of the functionality of the zero-power meniscus lens pair 1/mask combination and how the necessary diffraction orders are collected by the projection lens.

Conclusion

Special Merits of the Curved Mask Compensator

The illumination system is a very important part of the lithographic tool. It plays an important role in controlling the performance of the lithographic system. The field of projection lithography using planar masks and substrates has witnessed several important innovations in the field of illumination engineering that significantly improved the resolution and contrast of projection patterning. Projection lithography on curved substrates needs efficient illumination techniques to illuminate curved masks. The illuminating beam displaced and deviated by the bulk of a thick curved mask when used alone, needs to have a compensator in front of the mask for best results.

We discussed a novel optics device, called zero-power menisus lens pair 1, that has curved optical elements exhibiting zero total power and performs as good as a plane parallel plate causing no deviations to the incoming radiation. Having this unique null property zero-power meniscus lens pair 1 is expected to serve various applications as an alternative to plane parallel plate. We also use the zero-power meniscus lens pair 1 with curved mask on one of its outer surfaces, making the whole device very efficient in coupling the illumination beam to the imaging system.

Another important merit of this invention is that the two meniscus elements can also be arranged back-to-back on convex surfaces with concave outer surfaces and make the device still carry the same properties described above for zero-power meniscus lens pair 1. Hence either configuration could be referred to as part of the present invention.

The invention claimed is:

1. A projection lithography system, for curved surface lithography, having a number of required transmissive elements in a light path controlled by projection optics and illumination optics, in which
   the illumination optics has means to form an illumination compensator having the zero-power aggregate optical effect of two closely-spaced identical meniscus elements back-to-back, and the system is designed to provide patterning illumination to a curved substrate (3) in accordance with a curved mask (2), whose size and curvature are related to the size and curvature of the curved substrate (3);
   characterized by;
   a) radiation means (7);
   b) projection means (5);
   c) scanning means (8), to present, for scanning, both such curved mask (2) and such curved substrate (3) for imaging mask to substrate via said projection means (5), with means to move said projection means (5);
   whereby a scanning polygon of the curved mask pattern is imaged onto the curved substrate surface, and the substrate surface remains within the depth-of-focus of said projection means and said scanning polygon remains at substantially the same size: and
   d) means (1) in the illumination light path supporting such mask means (2is arranged to transmit the scanning beam undistorted in its shape and direction of propagation.

2. A projection lithography system, for curved surface lithography, having a number of required transmissive elements in a light path controlled by projection optics and illumination optics
   characterized in that:
   the illumination optics has means to form an illumination compensator having the zero-power aggregate optical effect of two closely-spaced identical meniscus elements back-to-back, characterized by:
   a) a curved substrate (3);
   b) a curved mask (2), whose size and curvature are related to the size and curvature of the curved substrate (3);
   c) radiation means (7):
   d) projection means (5); and
   e) scanning means (8), to present, for scanning, both said curved mask (2) and said curved substrate (3) for imaging mask to substrate via said projection means (5), with means to move said projection means (5);
   whereby the curved mask pattern is imaged onto the curved substrate surface, and the substrate surface remains within the depth-of-focus of said projection means and said scanning polygon remains at substantially the same size: and f) means (1) in the illumination light path supporting said mask means (2) to transmit the scanning beam undistorted in its shape and direction of propagation.

3. A projection lithography system for curved surface lithography, having a number of required transmissive elements in a light path controlled by projection optics and illumination optics characterized in that:

the illumination optics has means to form an illumination compensator having the zero-power aggregate optical effect of two closely-spaced identical meniscus elements back-to-back;

further characterized by:

a) a curved substrate (3);

b) a curved mask (2), whose size and curvature are related to the size and curvature of the curved substrate (3);

c) radiation means (7):

d) projection means (5); and a) scanning means (8), to present, for scanning, both said curved mask (2) and said curved substrate (3) for imaging mask to substrate via said projection means (5), with means to move said projection means (5); whereby the curved mask pattern is imaged onto the curved substrate surface, and the substrate surface remains within the depth-of-focus of said projection means and said scanning polygon remains at substantially the same size: and f) zero-power meniscus lens pair means (1) in the illumination light path supporting said mask means (2) to transmit the scanning beam undistorted in its shape and direction of propagation;

wherein said curved mask (2) is a photo-opaque pattern on the curved exit surface of said zero-power meniscus lens pair means (1).

4. A projection lithography system, for curved surface lithography, having a number of required transmissive elements in a light path controlled by projection optics and illumination optics characterized in that:

the illumination optics has means to form an illumination compensator having the zero-power aggregate optical effect of two closely-spaced identical meniscus elements back-to-back, wherein said curved mask (12) is identical in size and shape but opposite in convexity orientation to said curved substrate (11), further characterized by:

means to control defocus while scanning said curved mask (1) on said scanning means (15) by providing motion to said projection means or, as an alternative, to provide opposite motions to said mask and said substrate, along the optic axis of said lens, to correct for magnification errors by maintaining distances from object and conjugate image points to principal planes of said lens; and zoom control means to provide controlled motion to said condensing means calculated to keep the size of the illumination beam constant on said mask (1).

5. A projection lithography system according to claim 4, further characterized by means to provide compensating motion to said projection means (5), to maintain total track length to within the depth-of-focus; and zoom capability in said condensing means, calculated to keep the illumination beam focused on said curved mask with constant size.

6. A projection lithography system, for curved surface lithography, having a number of required transmissive elements in a light path controlled by projection optics and illumination optics characterized in that:

the illumination optics has means to form an illumination compensator having the zero-power aggregate optical effect of two closely-spaced identical meniscus elements back-to-back:

further characterized by;

a) a curved substrate (3);

b) a curved mask (2), whose size and curvature are related to the size and curvature of the curved substrate (3);

c) radiation means (7):

d) projection means (5); and e) scanning means (8), to present, for scanning, both said curved mask (2) and said curved substrate (3) for imaging mask to substrate via said projection means (5), with means to move said projection means (5); whereby the curved mask pattern is imaged onto the curved substrate surface, and the substrate surface remains within the depth-of-focus of said projection means and said scanning polygon remains at substantially the same size: and f) zero-power meniscus lens pair means (1) in the illumination light path supporting said mask means (2) to transmit the scanning beam undistorted in its shape and direction of propagation;

wherein said curved mask (2) is identical in size and shape but complementary in convexity orientation to said curved substrate (3);

further characterized in that said zero-power meniscus lens pair means (1) has two oppositely-oriented optical elements aggregating zero power, having an entry face and an exit face; and a curved patterning mask positioned directly on the exit face of said zero-power meniscus lens pair means (1).

7. A projection lithography system according to claim 6, further characterized in that said zero-power meniscus lens pair means (1), has a patterning mask element positioned in the projection beam path so that said zero-power meniscus lens pair means (1) elements when aggregated form a zero-power refractive device to direct the mask pattern forward.

8. A projection lithography system according to claim 7, further characterized in that said zero-power meniscus lens pair means (1), has a concave entry surface and a concave exit surface.

9. A projection lithography system according to claim 7, further characterized in that said zero-power meniscus lens pair means (1), has a convex entry surface and a convex exit surface.

10. A projection lithography system according to claim 7, characterized by:

a) an optically transparent mask body having surface curvature identical to known curvature of the substrate, having a photo-opaque pattern layer on said surface; and b) means forming a zero-power meniscus lens pair means (1) with said mask body by mounting an oppositely oriented optically transparent compensating body in dose proximity in the light path.

11. A projection lithography system for imaging a pattern from a curved mask onto a curved substrate, thereby maintaining the image within the depth of focus of the projection optics, using scanning techniques, characterized by:
  a) a curved substrate (3) mounted on a scanning platform;
  b) a curved transmissive mask (2), having an inverted orientation with respect to said curved substrate (3), mounted on said scanning platform;
  c) radiation means (7);
  d) projection means (5);
  e) scanning means (8), to present, for scanning and imaging a pattern from said curved mask (2) to curved substrate (3) via said projection means (5); and
  f) zero-power meniscus lens pair means (1) to minimize the effects of image anomalies related to curved mask (2) and support.

12. A projection lithography scanning system for imaging a curved mask onto a curved substrate, with provisions for control of defocus, which must be minimized for scanning systems, comprising:
  a) means for continuously adjusting the position of the projection lens along its axis, during scanning, with adjustments related to changes of topography of the curved mask and substrate, such that the object distance and image distance for the conjugate points at the center of the lens field remain constant during scanning, and
  b) means to keep the size of the scanning polygon constant on the curved mask and curved substrate.

* * * * *